United States Patent
Sayadi

(10) Patent No.: US 12,166,117 B2
(45) Date of Patent: Dec. 10, 2024

(54) GROUP III NITRIDE-BASED TRANSISTOR DEVICE

(71) Applicant: Infineon Technologies Austria AG, Villach (AT)

(72) Inventor: Luca Sayadi, Villach (AT)

(73) Assignee: Infineon Technologies Austria AG, Villach (AT)

( * ) Notice: Subject to any disclaimer, the term of this patent is extended or adjusted under 35 U.S.C. 154(b) by 436 days.

(21) Appl. No.: 17/558,985

(22) Filed: Dec. 22, 2021

(65) Prior Publication Data
US 2022/0199815 A1 Jun. 23, 2022

(30) Foreign Application Priority Data
Dec. 22, 2020 (EP) ..................................... 20216604

(51) Int. Cl.
| | |
|---|---|
| *H01L 29/778* | (2006.01) |
| *H01L 29/43* | (2006.01) |
| *H01L 29/47* | (2006.01) |
| *H01L 29/812* | (2006.01) |
| *H01L 29/10* | (2006.01) |
| *H01L 29/20* | (2006.01) |

(52) U.S. Cl.
CPC ........ *H01L 29/7786* (2013.01); *H01L 29/432* (2013.01); *H01L 29/475* (2013.01); *H01L 29/812* (2013.01); *H01L 29/1066* (2013.01); *H01L 29/2003* (2013.01)

(58) Field of Classification Search
CPC . H01L 29/1066; H01L 29/475; H01L 29/778; H01L 29/7786; H01L 29/802; H01L 29/812
See application file for complete search history.

(56) References Cited

U.S. PATENT DOCUMENTS

| | | | |
|---|---|---|---|
| 9,401,421 B2 | 7/2016 | Tomita et al. | |
| 2015/0295073 A1* | 10/2015 | Tomita | H01L 29/7781 |
| | | | 257/76 |

(Continued)

OTHER PUBLICATIONS

Roccaforte, Fabrizio et al., "An Overview of Normally-Off GaN-Based High Electron Mobility Transistors", Materials, vol. 12, No. 10, May 15, 2019, pp. 1-18.

*Primary Examiner* — Zandra V Smith
*Assistant Examiner* — Molly K Reida
(74) *Attorney, Agent, or Firm* — Murphy, Bilak & Homiller, PLLC

(57) ABSTRACT

In an embodiment, a Group III nitride-based transistor device is provided that includes a Group III nitride-based body and a p-type Schottky gate including a metal gate on a p-doped Group III nitride structure. The p-doped Group III nitride structure includes an upper p-doped GaN layer in contact with the metal gate and having a thickness $d_1$, a lower p-doped Group III nitride layer having a thickness $d_2$ and including p-doped GaN that is arranged on and in contact with the Group III nitride-based body, and at least one p-doped $Al_xGa_{1-x}N$ layer arranged between the upper p-doped GaN layer and the lower p-doped Group III nitride layer, wherein $0<x<1$. The thickness $d_2$ of the lower p-doped Group III nitride layer is larger than the thickness $d_1$ of the upper p-doped GaN layer.

17 Claims, 6 Drawing Sheets

(56) References Cited

U.S. PATENT DOCUMENTS

| | | |
|---|---|---|
| 2018/0366559 A1 | 12/2018 | Cao et al. |
| 2018/0366599 A1 | 12/2018 | Newman et al. |
| 2020/0185514 A1 | 6/2020 | Chen |

\* cited by examiner

GROUP III NITRIDE-BASED TRANSISTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). Group III nitride-based semiconductor devices, such as gallium nitride (GaN)-based transistor devices, are now emerging as attractive candidates to carry large currents, support high voltages and to provide very low on-resistance and fast switching times. Further improvements to the reliability of Group III nitride-based transistor devices are desirable.

SUMMARY

According to the invention, a Group III nitride-based transistor device is provided which comprises a Group III nitride-based body and a p-type Schottky gate comprising a metal gate on a p-doped Group III nitride structure. The p-doped Group III nitride structure comprises an upper p-doped GaN layer in contact with the metal gate and having a thickness $d_1$, a lower p-doped Group III nitride layer having a thickness $d_2$ and comprising GaN that is arranged on and in contact with the Group III nitride-based body and at least one p-doped $Al_xGa_{1-x}N$ layer arranged between the upper p-doped GaN layer and the lower p-doped Group III nitride layer, wherein 0<x<1. The thickness $d_2$ of the lower p-doped Group III nitride layer is larger than the thickness $d_1$ of the upper p-doped GaN layer.

Due to the provision of the p-doped Group III nitride structure in the p-type Schottky gate, the Group III nitride-based transistor device is an enhancement mode device which is normally off. Consequently, a positive bias has to be applied at the gate in order that the transistor device conducts current. In some embodiments, the Group III nitride-based body has a multilayer structure having a heterojunction that is capable of supporting a two-dimensional electron gas (2DEG) which forms the channel of the transistor device.

The Group III nitride-based transistor device according to the invention includes a p-doped Group III nitride structure between a metal gate and the Group III nitride-based body with an improved gate reliability. The invention is based on the realisation that the gate reliability of Group III nitride-based transistor comprising a p-type Schottky gate and a p-doped Group III nitride layer is limited by the time-dependent dielectric breakdown (TDDB) of the p-type Schottky gate junction. During on state operation of the transistor device, electrons are injected from the two-dimensional electron gas of the transistor device into the p-doped Group III nitride layer. If these injected electrons reach the high field Schottky depletion region, they can be accelerated to very high energies which leads to the creation of defects and junction breakdown.

According to the invention, one or more p-doped $Al_xGa_{(1-x)}N$ layers are introduced within the p-doped Group III nitride structure of the p-type Schottky gate in order to prevent the injected electrons from the two-dimensional electron gas (2DEG) reaching the Schottky depletion region. The structure provided herein encourages the injected electrons to recombine in the lower p-doped Group III nitride region that comprises GaN and that is arranged between the p-doped $Al_xGa_{(1-x)}N$ layer and the Group III nitride body.

In some embodiments, the lower p-doped Group III nitride layer is formed of a single composition and is formed of GaN.

In other embodiments, the lower Group III nitride layer comprises sublayers of differing composition and has a multilayer structure. In embodiments, in which the lower Group III nitride layer comprises sublayers, the lowermost sublayer that is in contact with the Group III nitride body is formed of p-doped GaN.

In some embodiments, a heterojunction between Group III nitride compounds of differing bandgaps is formed at the interface between the p-doped Group III nitride structure of the p-doped Schottky gate and the Group III nitride body.

By providing a structure including a stack of a lower p-doped GaN layer, a p-doped $Al_xGa_{(1-x)}N$ layer and an upper p-doped GaN layer between the metal gate and the Group III nitride-based body and by selecting the thickness of the lower p-doped GaN layer to be greater than the thickness of the higher p-doped GaN layer, the injected electrons from the two-dimensional electron gas are prevented from reaching the Schottky depletion region so that the gate lifetime is improved.

A Schottky depletion region having a thickness W is formed in the upper p-doped GaN layer at the interface to the metal gate. In some embodiments, the thickness of the upper p-doped GaN layer $d_1$ is larger than the thickness W of the Schottky depletion region.

Since the p-doped $Al_xGa_{(1-x)}N$ layer is spaced apart from the metal contact by the upper p-doped GaN layer, it is positioned below the Schottky depletion region so that the electric field at the metal/p-doped GaN interface and the hole tunnelling current unaffected. This arrangement is capable of selectively filtering out the electron gate current component of the gate current while leaving the hole component unaffected. As a certain hole current can be reliably supplied through the p-type Schottky gate, threshold voltage variations during device operation can be reduced.

In some embodiments, the width of the Schottky depletion region is 5 nm≤W<100 nm.

In some embodiments, the upper p-doped GaN layer has a width of 10 nm≤$d_1$≤100 nm or 10 nm≤$d_1$≤75 nm or 25 nm≤$d_1$≤50 nm.

In some embodiments, the doping concentration of the p-type dopants in the upper p-doped GaN layer is $10^{18}$ cm$^{-3}$ to $10^{20}$ cm$^{-3}$. The dopants may be magnesium.

The width of the Schottky depletion region is dependent on the doping concentration of the p-type dopants in the upper p-doped GaN layer. Consequently, the width $d_1$ of the upper p-doped GaN layer can be selected depending on the doping concentration so that its width $d_1$ is greater than the width W of the Schottky depletion region.

In some embodiments, the width of the lower p-doped Group III nitride layer is 20 nm≤$d_2$≤100 nm or 35 nm≤$d_2$≤100 nm or 35 nm≤$d_2$≤65 nm. As the injected electrons from the two-dimensional electron gas recombine in the lower p-doped Group III nitride layer, $d_2$ can be selected to avoid excessive electron pile up in the lower p-doped Group III nitride layer which could lead to electron leak across the p-doped $Al_xGa_{(1-x)}N$ layer. The minimum width $d_2$ also depends on the electron lifetime in the p-doped layer which depends on the doping concentration. The electron lifetime decreases as the doping concentration increases.

In some embodiments, the p-doped Group III nitride structure has a total thickness of 55 nm to 150 nm or 75 nm to 150 nm. The total height of the p-doped Group III nitride structure may be selected in response to manufacturing considerations due to the effects of the etching process used to form the stack. The p-doped Group III nitride structure has a width that corresponds to the width of the metal gate.

In some embodiments, the p-doped $Al_xGa_{1-x}N$ layer has a thickness of 5 nm to 30 nm or 5 nm to 20 nm.

In some embodiments, the aluminium content in the p-doped $Al_xGa_{(1-x)}N$ layer is $0.05 \leq x \leq 0.40$. Increasing the aluminium content x can be used to decrease the gate electron current. However, in order to avoid instability in the threshold voltage, hole transport through the stack should not be hindered and excessive charge storage in the lower p-doped Group III nitride layer should be avoided so that the aluminium content should not be too high. An aluminium content x of $0.05 \leq x \leq 0.40$ or $0.25 \leq x \leq 0.35$ is found to be suitable.

In some embodiments, the lower p-doped Group III nitride layer comprises three or more sublayers, wherein a lowermost sublayer is a p-doped GaN layer that is arranged on and in contact with the Group III nitride-based body, a p-doped $Al_xGa_{(1-x)}N$ sublayer is arranged on the lowermost p-doped GaN sublayer and a p-doped GaN sublayer is arranged on the p-doped $Al_xGa_{(1-x)}N$ sublayer. Adjacent p-doped $Al_xGa_{1-x}N$ layers in the p-doped Group III nitride-based structure are separated by a p-doped GaN sublayer. The electron current can be reduced further by increasing the number of p-doped $Al_xGa_{(1-x)}N$ layers.

In some embodiments, the p-doped Group III nitride-based structure of the p-type Schottky gate comprises two or more p-doped $Al_xGa_{1-x}N$ layers, whereby adjacent p-doped $Al_xGa_{1-x}N$ layers are separated by an intermediate p-doped GaN layer.

In some embodiments, the metal gate comprises a metal or an alloy that forms a Schottky contact to the upper p-doped GaN layer. The metal gate may comprise one or more of the group consisting of TiN, Ti, W, $WSi_x$, Ta and TaN.

In some embodiments, the Group III nitride-based transistor device further comprises a source ohmic contact and a drain ohmic contact positioned on the first major surface of a Group III nitride-based body. The p-type Schottky gate is laterally arranged between the source ohmic contact and the drain ohmic contact. The source ohmic contact and the drain ohmic contact may be formed of a metal stack comprising Ti, Al and a capping metal.

In some embodiments, the Group III nitride-based body is arranged on a substrate that has a growth surface capable of supporting the epitaxial growth of at least one Group III nitride layer.

In some embodiments, the Group III nitride-based body comprises a buffer structure arranged on the growth surface, a Group III nitride channel layer arranged on the buffer structure and a Group III nitride barrier layer arranged on the Group III nitride channel layer, thus forming a heterojunction therebetween that is capable of supporting a two-dimensional electron gas. The p-type Schottky gate is arranged on the Group III nitride barrier layer. The lower p-doped Group III nitride layer is in direct contact with the Group III nitride barrier layer.

In some embodiments, the channel layer comprises GaN and the barrier layer comprises $Al_xGa_{(1-x)}N$, whereby $0<x<1$. The Group III nitride-based body may be intrinsically or unintentionally doped.

As the Group III nitride-based transistor includes the p-doped Group III nitride structure between the metal gate and the Group III nitride barrier layer, the two-dimensional electron gas is depleted at the region below the gate when no voltage applied to the gate so that the Group III nitride-based transistor is an enhancement mode device which is normally off. When a positive bias is applied to the gate, current can be carried by the two-dimensional electron gas.

In some embodiments, the Group III nitride-based transistor is a High Electron Mobility Transistor (HEMT).

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
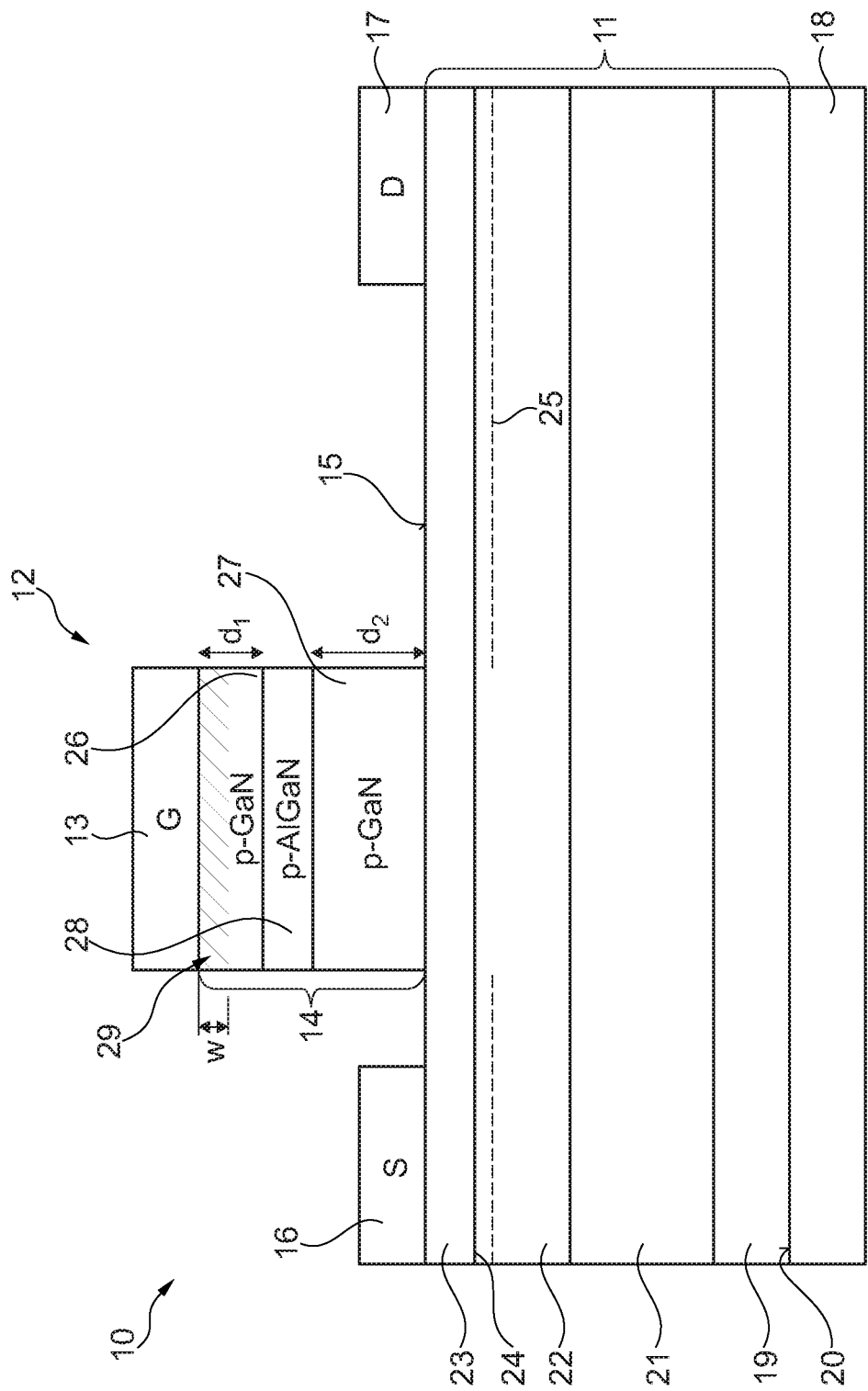
FIG. 1 illustrates a schematic cross-sectional view of a Group III nitride-based transistor device including a p-type Schottky gate with a metal gate on a p-doped Group III nitride structure according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

FIG. 1 illustrates a schematic cross-sectional view of a Group III nitride-based transistor device 10 which comprises a Group III nitride-based body 11 and a p-type Schottky gate 12. The p-type Schottky gate 12 comprises a metal gate 13 on a p-doped Group III nitride structure 14. The p-type Schottky gate 12 is arranged on a first main surface 15 of the Group III nitride-based substrate 11 and is positioned between and spaced apart from a source electrode 16 and a drain electrode 17. The source electrode 16 and the drain electrode 17 each form an ohmic contact to the Group III nitride body 11. The p-doped Group III nitride structure 14 is positioned on the first main surface 15 between the semiconductor body 11 and the metal gate 13 of the p-type Schottky gate 12.

The source electrode 16, drain electrode 17 and p-type Schottky gate 12 each have an elongate form with the longest direction extending into the plane of the drawing and extend substantially parallel to one another.

The Group III nitride-based body 11 is positioned on a substrate 18 and comprises a multilayer structure. The Group III nitride-based layer 11 comprises a transition layer 19 arranged on a first surface 20 of the substrate 18, a buffer layer 21 arranged on the transition layer 19, a channel layer 22 formed on the buffer layer 21 and a barrier layer 23 arranged on the channel layer 22.

The first surface 20 of the substrate 18 provides a growth surface which is capable of supporting the epitaxial growth of the Group III nitride body 11. The substrate 18 is commonly formed of a material other than a Group III nitride and may be called a foreign substrate. The substrate 18 may be formed of silicon and may be formed of monocrystalline silicon or an epitaxial silicon layer, or may be formed of SiC or sapphire.

The channel layer 22 and the barrier layer 23 have different compositions and different bandgaps such that a heterojunction is formed at the interface 24 and such that a two-dimensional electron gas, indicated schematically in FIG. 1 by the dashed line 25, is formed at the heterojunction. The two-dimensional electron gas is formed by spontaneous and piezoelectric polarisation. The channel layer 22 may be formed of GaN and the barrier layer 23 may be formed of $Al_xGa_{(1-x)}N$. The Group III nitride-based transistor may be a High Electron Mobility Transistor (HEMT).

In some non-illustrated embodiments, the Group III nitride-based semiconductor body 11 may further include a back barrier layer. The channel layer 22 is formed on the back barrier layer and forms a heterojunction with the back barrier layer and the barrier layer 23 is formed on channel layer 22. The back barrier layer has a different bandgap to the channel layer and may comprise $Al_xGa_{(1-x)}N$, for example. The composition of the $Al_xGa_{(1-x)}N$ of the back barrier layer, i.e. aluminium content x, may differ from the composition of the $Al_xGa_{(1-x)}N$ used for the barrier layer 23.

The transition layer 19 and buffer layer 21 may each include multiple sublayers. A typical transition and buffer structure 19, 21 for a silicon substrate includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer or $Al_xGa_{(1-x)}N$ back barrier, if present, is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

The p-doped Group III nitride structure 14 of the p-type Schottky gate 12 is positioned between the metal gate 13 and the first main surface 15 of the Group III nitride body 11 and depletes the two-dimensional electron gas 25 in the region underneath the p-type Schottky gate 12 such that the transistor device 10 is an enhancement mode device which is normally off. Consequently, a positive voltage is applied to the p-type Schottky gate 12 to switch on the transistor device 10 such that current can be carried between the source electrode 16 and the drain electrode 17.

The p-doped Group III nitride structure 14 of the p-type Schottky gate 12 comprises an upper p-doped doped GaN layer 26 which is in contact with the metal gate 13 and which has a thickness $d_1$. The p-doped Group III nitride structure 14 further comprises a lower p-doped Group III nitride layer 27 having a thickness $d_2$ that is arranged on and is in contact with the Group III nitride-based body 11. The lower p-doped Group III nitride layer 27 comprises GaN. The lower p-doped Group III nitride layer 27 is in contact with the $Al_xGa_{(1-x)}N$ barrier layer 23. The p-doped Group III nitride structure 14 further comprises at least one p-doped doped $Al_xGa_{(1-x)}N$ layer 28 which is arranged between the upper p-doped GaN layer 26 and the lower p-doped Group III nitride layer 27. The aluminium content x of the p-doped $Al_xGa_{(1-x)}N$ layer is between 0 and 1. The thickness $d_2$ of the lower p-doped Group III nitride layer 27 is greater than the thickness $d_1$ of the upper p-doped GaN layer 26.

In some embodiments, such as that illustrated in FIG. 1, the lower p-doped Group III nitride layer 27 is formed of a single composition and is formed of GaN. In other embodiments, such as that illustrated in FIG. 3, the lower Group III nitride layer 27 comprises sublayers of differing composition and has a multilayer structure. In embodiments, in which the lower Group III nitride layer 27 comprises sublayers, the lowermost sublayer that is in contact with the barrier layer 23 comprises GaN. In both arrangements, a heterojunction between Group III nitride compounds of differing bandgaps is formed at the interface between the p-doped Group III nitride structure 14 of the p-doped Schottky gate 12 and the Group III nitride body 11.

The metal gate 13 comprises a metal or an alloy that forms a Schottky contact to the upper p-doped began layer 26. The metal gate may comprise one or more of the group consisting of titanium nitride (TiN), titanium, tungsten, tungsten silicide ($WSi_x$), tantalum and tantalum nitride (TaN).

In a Schottky gate, a Schottky depletion region 29 is formed below the metal gate 13 due to the formation of Schottky contact between the metal gate 13 and the underlying material, in this case the upper p-doped GaN layer 26. This Schottky depletion region 29 is indicated in FIG. 1 by the hashed region and has a width W.

In the event that electrons from the two-dimensional gas reach the high field Schottky depletion region 29, the electrons can be accelerated to high-energies, leading to defect creation and junction breakdown. This can negatively influence the gate reliability of Group III nitride-based transistor devices including a p-type Schottky gate with a p-doped Group III nitride layer. The p-doped doped $Al_xGa_{(1-x)}N$ layer 28 serves to prevent electrons injected from the two-dimensional electron gas 25 into the p-type Schottky gate 12 during the on state of the transistor device 10 from reaching the metal gate 13 and also from reaching the Schottky depletion region 29.

The p-doped $Al_xGa_{(1-x)}N$ layer 28 is positioned within the stack such that a p-doped GaN layer 26, 27 is arranged on two opposing sides in a direction between the two-dimensional electron gas 25 and the metal gate 13. Due to this position of the p-doped $Al_xGa_{(1-x)}N$ layer 28 in the sack, electrons injected from the two-dimensional electron gas are prevented from reaching the Schottky depletion region 29 and are forced to recombine in the lower p-doped GaN layer 27 which is positioned between p-doped doped $Al_xGa_{(1-x)}N$ layer 28 and the $Al_xGa_{(1-x)}N$ barrier layer 23.

Since the p-doped $Al_xGa_{(1-x)}N$ layer 28 is spaced apart from the metal gate layer 13, the electric field between the metal gate 13 and the upper p-doped doped layer 26 is unaffected such that the hole tunnelling current is unaffected.

The risk of threshold voltage variations during device operation is reduced. Therefore, the p-doped Group III nitride structure 14 selectively filters out the electron gate current component while leaving the hole current component of the gate current unaffected. This is illustrated by the simulation results given in FIG. 2.

The thickness $d_1$ of the upper p-doped GaN layer 26 may be greater than the larger than the thickness W of the Schottky depletion region. In some embodiments, the Schottky depletion region has a thickness of 5 nm≤W<100 nm and the thickness $d_1$ of the upper p-doped player lies in the range 10 nm≤$d_1$≤100 nm or 10 nm≤$d_1$≤75 nm or 25 nm≤$d_1$≤50 nm.

The p-doped Group III nitride structure may have an overall thickness of 55 nm to 150 nm or 75 nm to 150 nm.

Figure 2:
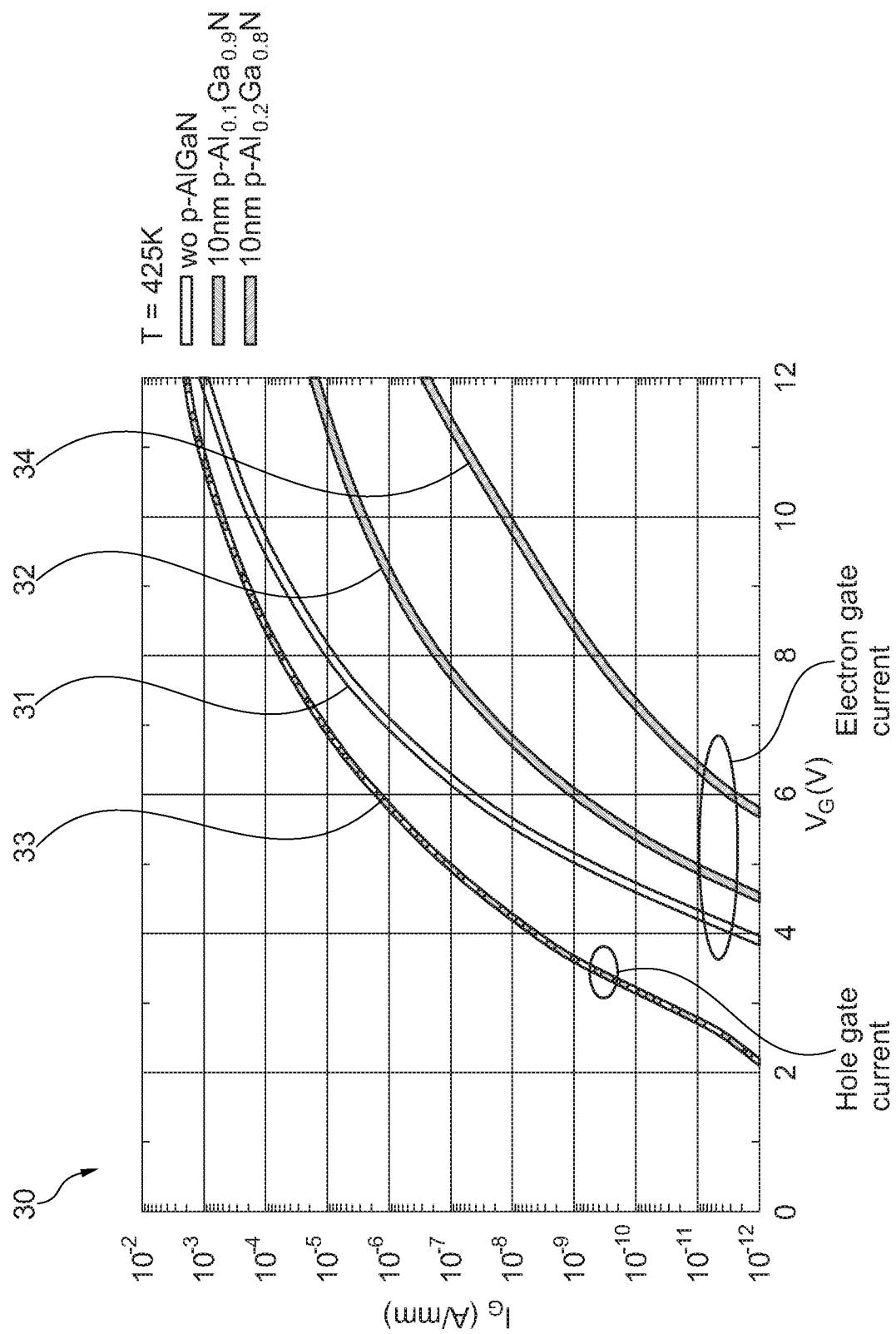
FIG. 2 illustrates a graph of simulation results of the gate electron current as a function of the aluminium content of a single p-doped $Al_xGa_{(1-x)}N$ layer of the p-doped Group III nitride structure.

FIG. 2 illustrates simulation results for a transistor device having the structure illustrated in FIG. 1 with a single p-doped $Al_xGa_{(1-x)}N$ layer 28 in the p-doped Group III nitride structure 14, curve 32, and a reference transistor device without a p-doped $Al_xGa_{(1-x)}N$ layer in the p-doped Group III nitride structure, curve 31. The simulation results are presented in the form of a graph 30 of gate current $I_G$ against gate voltage $V_G$. The curve 31 shows the electron gate current for the reference device without a p-doped $Al_xGa_{(1-x)}N$ layer. The curve 32 shows the electron gate current for a transistor device including a single p-doped $Al_xGa_{(1-x)}N$ layer 28 having a thickness of 10 nm and an aluminium content x of 0.1.

FIG. 2 also illustrates simulation results which illustrate the effect of the aluminium content x of the single p-doped $Al_xGa_{(1-x)}N$ layer 28 in the Group III nitride-based structure 14 illustrated in FIG. 1. The curve 34 illustrates the results obtained for a transistor device including a single p-doped $Al_xGa_{(1-x)}N$ layer 28 having a thickness of 10 nm but with an increased aluminium content x of 0.2. For all positive gate voltages $V_G$ and in particular for the operating gate voltage, e.g. 5V, the hole component of the gate current in unaffected by the insertion of the p-doped $Al_xGa_{(1-x)}N$ layer 28—if properly designed—whereas the electron gate current is reduced by several orders of magnitude, the higher the aluminium content, the stronger the reduction. As the hole gate current tis unaffected for all three transistor devices, the curve 33 represents the hole gate current for all three transistor devices.

Figure 3:
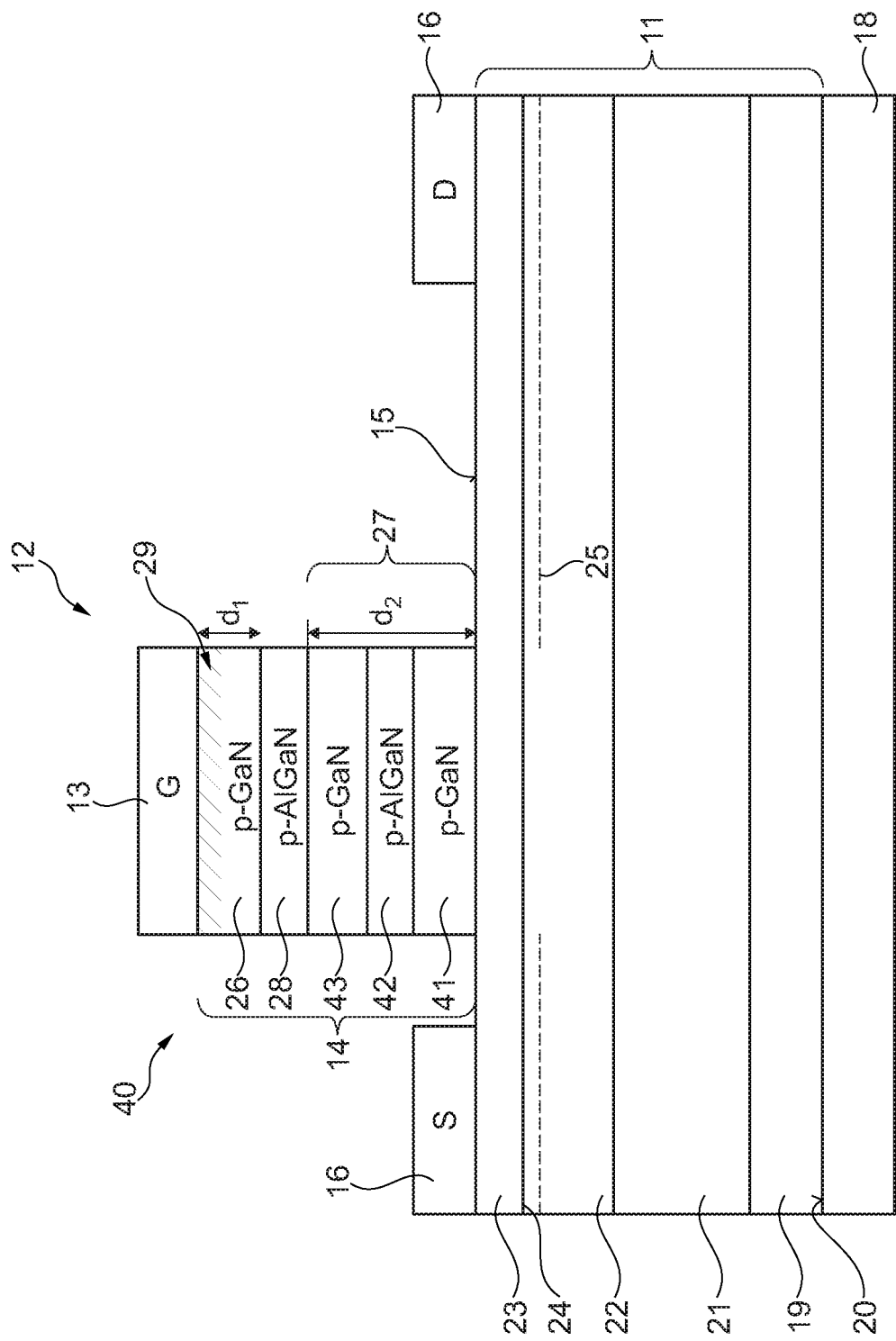
FIG. 3 illustrates a schematic cross-sectional view of a Group III nitride-based transistor device including a p-type Schottky gate with a metal gate on a p-doped Group III nitride structure according to an embodiment.

FIG. 3 illustrates a schematic cross-sectional view of a Group III nitride-based transistor device 40 including a p-type Schottky gate 12 with a metal gate 13 on a p-doped Group III nitride structure 14 according to an embodiment.

The p-doped Group III nitride structure 14 differs from that illustrated in FIG. 1 in that the lower p-doped Group III nitride layer 27 comprises three sublayers; a lowermost p-doped GaN layer 41 that is arranged on and in contact with the Group III nitride-based body, a p-doped $Al_xGa_{(1-x)}N$ sublayer 42 that is arranged on the lowermost p-doped GaN sublayer and a p-doped GaN sublayer 43 that is arranged on the p-doped $Al_xGa_{(1-x)}N$ sublayer 42. The p-doped sublayer 43 is also in contact with the p-doped $Al_xGa_{(1-x)}N$ layer 28.

The total thickness of the three sublayers 41, 42, 43 of the p-doped GaN layer 27 is $d_2$ and $d_2$ is larger than $d_1$. In the p-doped Group III nitride structure 14, adjacent p-doped $Al_xGa_{1-x}N$ layers are separated by a p-doped GaN layer. This structure of alternating p-doped $Al_xGa_{(1-x)}N$ and p-doped GaN layers 28, 43, 42, 41 is arranged between the upper p-doped GaN layer 26 and the barrier layer 23 such that an alternating p-doped GaN/AlGaN stack is formed.

In some embodiments, the upper p-doped GaN layer 26 has a thickness of 30 nm, the p-doped $Al_xGa_{(1-x)}N$ layer 28 has a thickness of 10 nm and the thickness of the lower p-doped GaN layer 27 is 60 nm, whereby the p-doped GaN sublayers 41, 43 each have a thickness of 25 nm and the p-doped $Al_xGa_{(1-x)}N$ sublayer 42 has a thickness of 10 nm. The total thickness of the Group III nitride structure 14 is 100 nm.

In the embodiment illustrated in FIG. 3, two $Al_xGa_{(1-x)}N$ layers 28, 42 separated by single intermediate p-doped GaN layer 43 are provided. However, more than two $Al_xGa_{(1-x)}N$ layers may be provided in the Group III nitride structure 14 by increasing the number of sublayers in the lower p-doped GaN layer 27 whereby adjacent p-doped $Al_xGa_{(1-x)}N$ sublayers are separated by an intermediate p-doped doped GaN sublayer so that in the Group III nitride structure 14 an alternating $GaN/Al_xGa_{(1-x)}N$ stacked arrangement is provided.

In embodiments including two or more $Al_xGa_{(1-x)}N$ layers, the aluminium content of the $Al_xGa_{(1-x)}N$ layers may be substantially the same or may differ.

Figure 4:
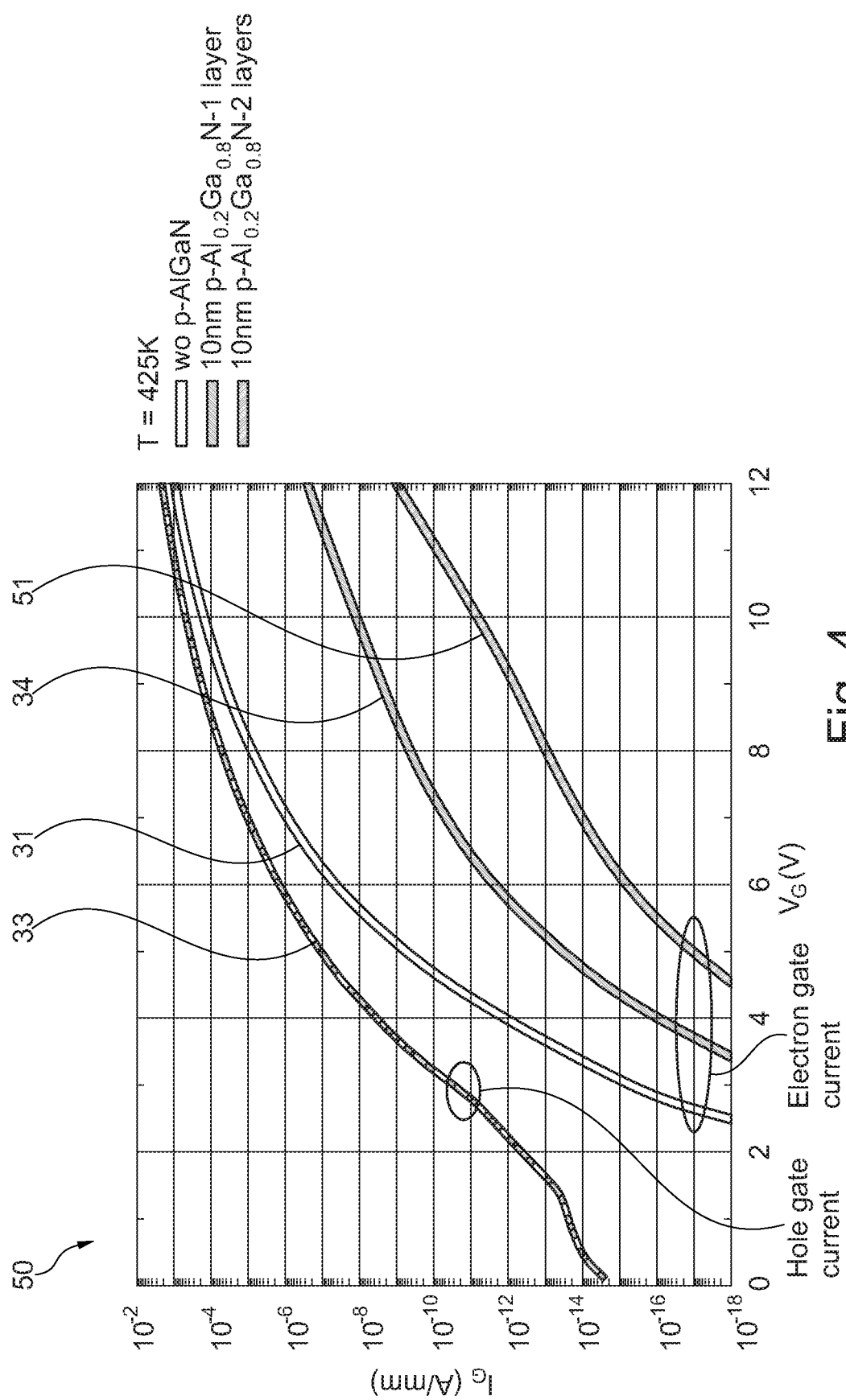
FIG. 4 illustrates a graph of simulation results of the gate electron current as a function of the number of p-doped $Al_xGa_{(1-x)}N$ layers in the p-doped Group III nitride structure of a p-type Schottky gate.

FIG. 4 illustrates simulation results in the form of a graph 50 of the gate electron current $I_G$ against gate voltage $V_G$ for different numbers of p-doped $Al_xGa_{(1-x)}N$ layers in the p-doped Group III nitride structure. The curve 31 shows the electron current for a reference transistor device without a p-doped $Al_xGa_{(1-x)}N$ layer, the curve 34 shows the electron current for a transistor device with a single p-doped $Al_xGa_{(1-x)}N$ layer having a thickness of 10 nm and an aluminium content of 0.2, respectively, correspond to the curves 31 and 34 of FIG. 2.

FIG. 4 also illustrates a curve 51 for a transistor device having a p-doped Group III nitride structure having two p-doped $Al_xGa_{(1-x)}N$ layers each having a thickness of 10 nm and an aluminium content of 0.2 which are separated by an intermediate p-doped GaN layer. In this example transistor device, the lower Group III nitride layer 27 includes three sublayers; a lowermost p-doped GaN sublayer 41, a $Al_xGa_{(1-x)}N$ sublayer 42 on the lowermost GaN sublayer 41 and a p-doped GaN sublayer 43 on the p-doped $Al_xGa_{(1-x)}N$ sublayer 42. A GaN/AlGaN stack is formed with an upper p-doped GaN sublayer 26 that contacts that Schottky gate metal 13, a p-doped $Al_xGa_{(1-x)}N$ layer 28, p-doped GaN sublayer 43, a p-doped $Al_xGa_{(1-x)}N$ sublayer 42 and a lowermost p-doped GaN sublayer 41 arranged in this order between the Schottky gate metal 13 and the Group III nitride-based body 11.

As can be seen in FIG. 4, the reduction in the electron gate current is greater for the device with two p-doped $Al_xGa_{(1-x)}N$ layers shown by the curve 51 compared to the device having a single p-doped $Al_xGa_{(1-x)}N$ layer shown by the curve 34 so that the higher the number of p-doped $Al_xGa_{(1-x)}N$ layers. The hole gate current is unaffected by the increase in the number of p-doped $Al_xGa_{(1-x)}N$ layers so that the curve 33 represents the hole current for all of the devices.

As discussed above, a Schottky depletion region 29 is formed under the metal gate and has a certain width W. It is advantageous that the thickness $d_1$ of the upper p-doped GaN layer 26 is greater than the width W of the Schottky depletion region in order on the one hand not to alter the electric field at the surface and hence the hole current and on the other hand to maximise the blocking action of the p-doped $Al_xGa_{(1-x)}N$ layer, i.e. in order to minimise the electron gate current. It is known from the theory of Schottky junctions that the width W of the Schottky depletion region 29 depends on the doping concentration of the p dopants, for example magnesium, in the upper p-doped GaN layer 26.

Figure 5:
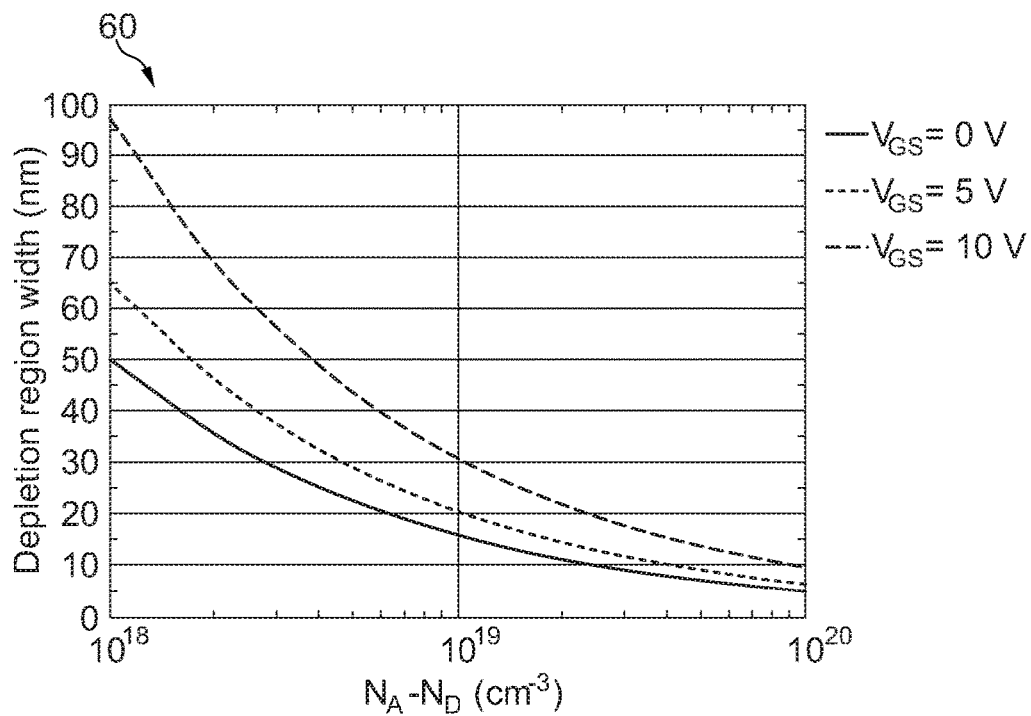
FIG. 5 illustrates a graph of simulation results of the width of the Schottky depletion region of the Group III nitride-based transistor device including a p-type Schottky gate with a metal gate on a p-doped Group III nitride structure.

FIG. 5 illustrates simulation results in the form of a graph 60 of the width W of the Schottky depletion region 29 of a Group III nitride-based transistor device including a p-type Schottky gate 12 with a metal gate 13 on a p-doped Group III nitride structure 14 against net acceptor concentration of the upper p-doped GaN layer 26 for different gate source voltages. Typically, a doping concentration of the p-type dopants in the upper p-doped GaN layer 26 is $10^{18}$ cm$^{-3}$ to $10^{20}$ cm$^{-3}$ is used. Therefore, as can be inferred from FIG. 5, the depletion width W of the depletion region 29 may range from around 5 nm to 100 nm for doping concentrations within this range and for gate source voltages of 0 to 10 V.

Figure 6:
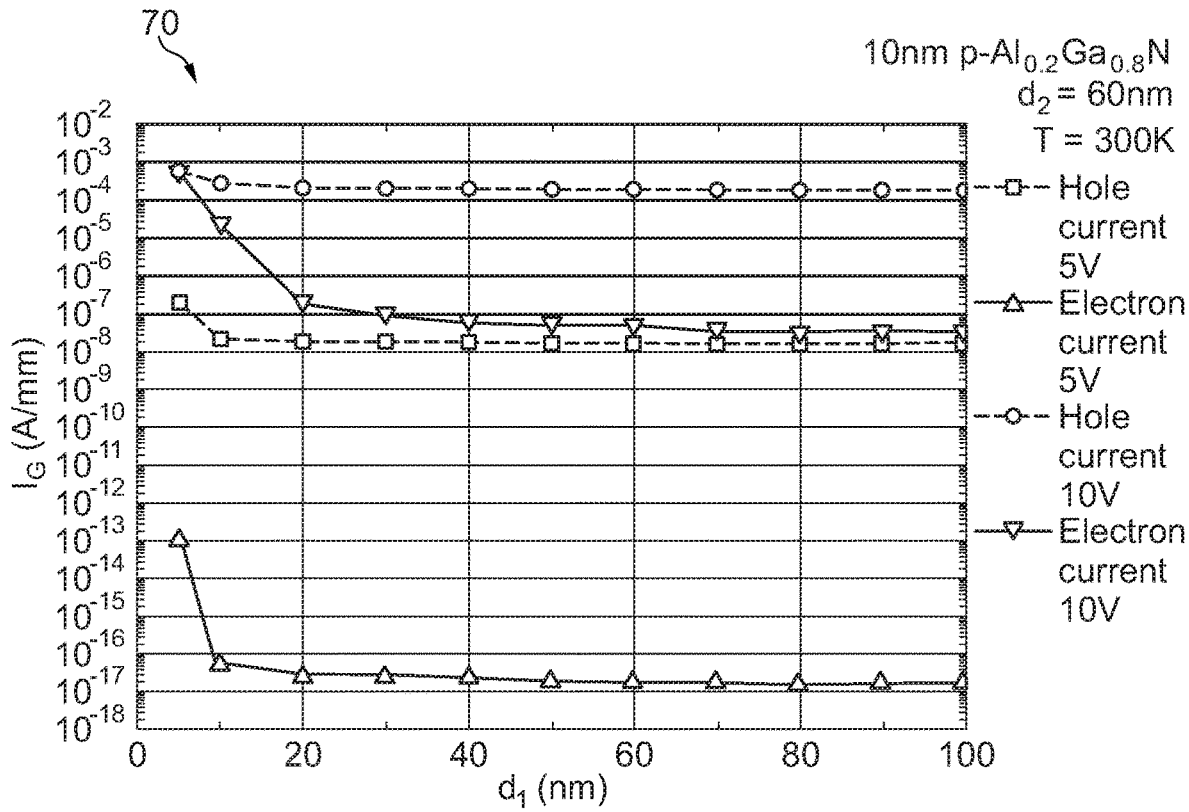
FIG. 6 illustrates a graph of simulation results of the gate current for different thicknesses of the upper p-doped GaN layer of the p-doped Group III nitride structure of a p-type Schottky gate.

FIG. 6 illustrates simulation results in the form of a graph 70 showing the hole gate current and electron gate current of a Group III nitride-based transistor device having different thicknesses $d_1$ of the upper p-doped GaN layer 26 of the p-doped Group III nitride structure 14. In this example, the lower p-doped Group III nitride layer 27 is formed of a single p-doped GaN layer. Two gate source voltages $V_{GS}$ of 5 and 10 V are illustrated. The p-doped $Al_xGa_{(1-x)}N$ layer 28 has a thickness of 10 nm and aluminium content x of 0.2 and the lower p-doped GaN layer 27 has a thickness of 60 nm. As can be inferred from the simulation results of FIG. 6, for this set of parameters, the thickness $d_1$ of the upper p-doped GaN layer 26 should be greater than around 30 nm in order to on the one hand not to alter the electric field at the surface and hence the hole current and on the other hand to maximise the blocking action of the p-doped $Al_xGa_{(1-x)}N$ layer 28, i.e. in order to minimise the electron gate current.

Figure 7:
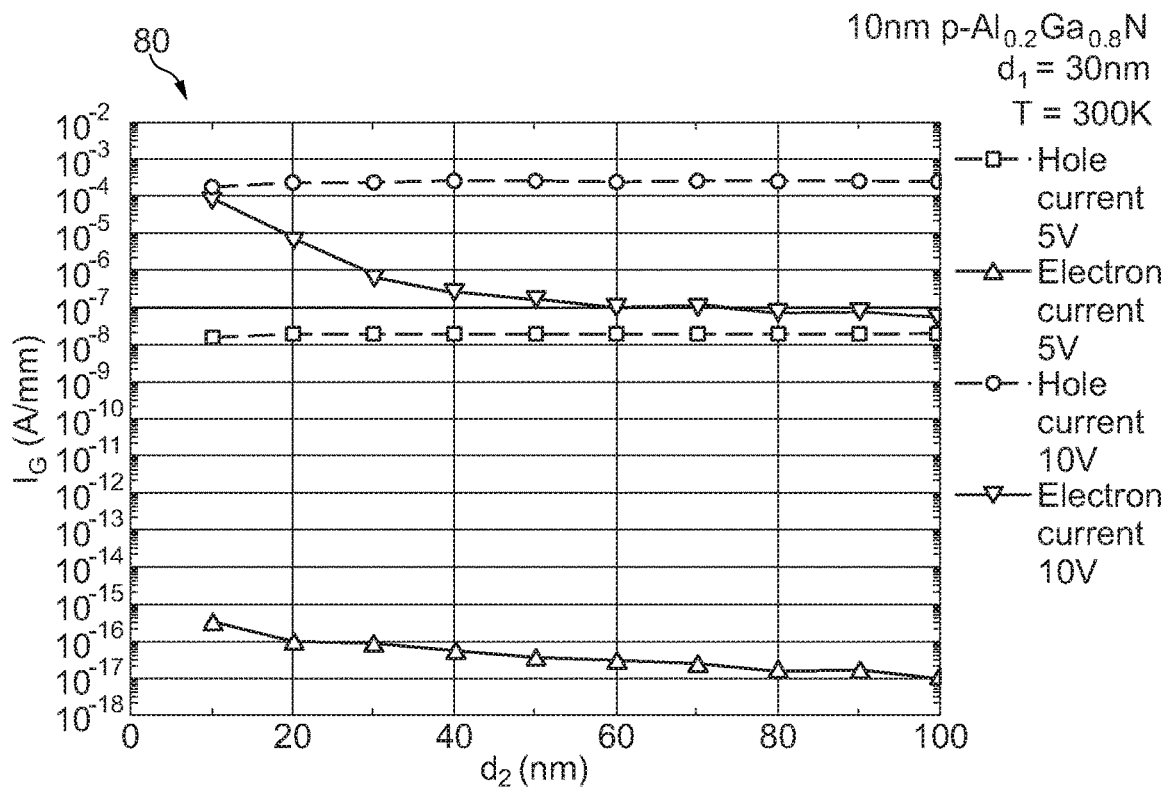
FIG. 7 illustrates a graph of simulation results of the gate current for different thicknesses of the lower p-doped GaN layer of the p-doped Group III nitride structure of a p-type Schottky gate.

FIG. 7 illustrates simulation results in the form of a graph 80 of the hole gate current and electron gate current of a Group III nitride-based transistor device for different thicknesses $d_2$ of the lower p-doped Group II nitride layer 27 of the p-doped Group III nitride structure 14 for gate source voltages of 5V and 10 V. In this example, the lower p-doped Group III nitride layer 27 is formed of a single p-doped GaN layer. For the simulation, a single p-doped $Al_xGa_{(1-x)}N$ layer 28 having a thickness of 10 nm and an aluminium content x of 0.2 and an upper p-doped GaN layer 26 having a thickness $d_1$ of 30 nm was selected.

As the electrons injected into the p-doped Group III nitride structure 14 from the two-dimensional electron gas should ideally fully recombine in the lower p-doped GaN layer 27, the thickness $d_2$ should be selected to avoid excessive electron pileup in the lower p-doped GaN layer 27 which would lead to increased electron leak across the p-doped $Al_xGa_{(1-x)}N$ layer 28 and into the Schottky depletion region 29. The minimum thickness $d_2$ of the lower p-doped GaN layer 27 depends on the electron lifetime in the lower p-doped GaN layer 27, whereby the longer the lifetime, the larger the thickness should be. The electron lifetime decreases as the doping concentration increases.

As can be inferred from the simulation results of FIG. 7, for this transistor device and this set of parameters, the thickness $d_2$ of the lower p-doped GaN layer 27 should be greater than around 40 nm in order to minimise the electron current.

Figure 8:
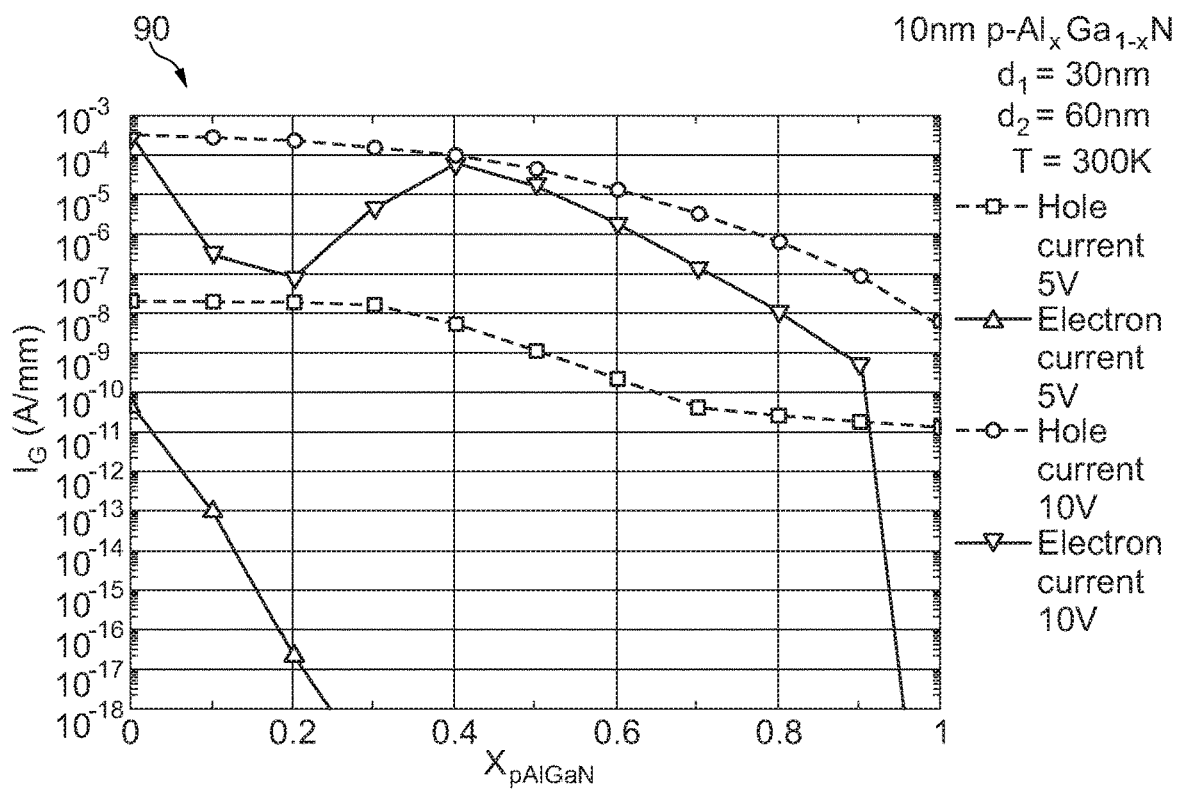
FIG. 8 illustrates a graph of simulation results of the gate current for different aluminium contents of a p-doped $Al_xGa_{(1-x)}N$ layer in the p-doped Group III nitride structure of a p-type Schottky gate.

FIG. 8 illustrates simulation results in the form of a graph 90 of the gate current of a Group III nitride-based transistor device for different aluminium contents x in a p-doped $Al_xGa_{(1-x)}N$ layer in the p-doped Group III nitride structure. A structure including a single p-doped $Al_xGa_{(1-x)}N$ layer 28 having a thickness of 10 nm, an upper p-doped GaN layer 26 having a thickness of 30 nm and a lower p-doped GaN layer 27 having a thickness of 60 nm was considered for gate source voltages of 5 and 10 V. For this set of parameters, it can be inferred from FIG. 8, that the aluminium content x should be less than around 0.3 in order that the hole current remains high and to avoid excessive electron accumulation at the interface between the p-doped $Al_xGa_{(1-x)}N$ layer 28 and the lower p-doped GaN layer 27 which could lead to a higher electron injection across the p-doped $Al_xGa_{(1-x)}N$ layer 28 and to threshold instabilities.

In order to preserve the threshold voltage stability, the hole transport of holes through the Group III nitride structure 14 should not be hindered and excessive charge storage in the lower p-doped GaN layer 27 should also be avoided. Therefore, the aluminium content of the p-doped $Al_xGa_{(1-x)}N$ layer 28 should not be too high.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Group III nitride-based transistor device, comprising:
   a Group III nitride-based body; and
   a p-type Schottky gate comprising a metal gate on a p-doped Group III nitride structure, wherein the p-doped Group III nitride structure comprises:
      an upper p-doped GaN layer in contact with the metal gate and having a thickness $d_1$;
      a lower p-doped Group III nitride layer having a thickness $d_2$ and comprising p-doped GaN that is arranged on and in contact with the Group III nitride-based body; and
      at least one p-doped $Al_xGa_{1-x}N$ layer arranged between the upper p-doped GaN layer and the lower p-doped Group III nitride layer,
      wherein $0<x<1$,
      wherein the thickness $d_2$ of the lower p-doped Group III nitride layer is larger than the thickness $d_1$ of the upper p-doped GaN layer,
   wherein a Schottky depletion region having a thickness W is formed in the upper p-doped GaN layer at an interface to the metal gate,
   wherein the thickness $d_1$ of the upper p-doped GaN layer is larger than the thickness W of the Schottky depletion region.

2. The Group III nitride-based transistor device of claim 1, wherein 5 nm≤W<100 nm.

3. The Group III nitride-based transistor device of claim 1, wherein a doping concentration of p-type dopants in the upper p-doped GaN layer is in a range of $10^{18}$ cm$^{-3}$ to $10^{20}$ cm$^{-3}$.

4. The Group III nitride-based transistor device of claim 1, wherein 10 nm≤$d_1$≤100 nm.

5. The Group III nitride-based transistor device of claim 1, wherein 20 nm≤$d_2$≤100 nm.

6. The Group III nitride-based transistor device of claim 1, wherein the p-doped Group III nitride structure has a thickness in a range of 55 nm to 150 nm.

7. The Group III nitride-based transistor device of claim 1, wherein the p-doped $Al_xGa_{1-x}N$ layer has a thickness in a range of 5 nm to 30 nm.

8. The Group III nitride-based transistor device of claim 1, wherein 0.05≤x≤0.40.

9. The Group III nitride-based transistor device of claim 1, wherein the lower p-doped Group III nitride layer comprises three or more sublayers, wherein a lowermost sublayer is a p-doped GaN layer that is arranged on and in contact with the Group III nitride-based body, a p-doped $Al_xGa_{(1-x)}N$ sublayer is arranged on the lowermost p-doped GaN sublayer and a p-doped GaN sublayer is arranged on the p-doped $Al_xGa_{(1-x)}N$ sublayer, and wherein adjacent p-doped $Al_xGa_{1-x}N$ layers in the p-doped Group III nitride-based structure are separated by a p-doped GaN sublayer.

10. The Group III nitride-based transistor device of claim 1, wherein the metal gate comprises a metal or an alloy that forms a Schottky contact to the upper p-doped GaN layer.

11. The Group III nitride-based transistor device of claim 1, wherein the metal gate comprises one or more metals or metal alloys selected from the group consisting of TiN, Ti, W, $WSi_x$, Ta and TaN.

12. The Group III nitride-based transistor device of claim 1, further comprising a source ohmic contact and a drain ohmic contact positioned on a first major surface of the Group III nitride-based body, and wherein the p-type Schottky gate is laterally arranged between the source ohmic contact and the drain ohmic contact.

13. The Group III nitride-based transistor device of claim 1, wherein the Group III nitride-based body is arranged on a substrate that has a growth surface capable of supporting epitaxial growth of at least one Group III nitride layer and the Group III nitride-based body comprises a buffer structure arranged on the growth surface, a Group III nitride channel layer arranged on the buffer structure, a Group III nitride barrier layer arranged on the Group III nitride channel layer and forming a heterojunction therebetween, and wherein the p-type Schottky gate is arranged on the Group III nitride barrier layer.

14. The Group III nitride-based transistor device of claim 1, wherein the Group III nitride-based transistor is a HEMT (High Electron Mobility Transistor).

15. A Group III nitride-based transistor device, comprising:
   a Group III nitride-based body; and
   a p-type Schottky gate comprising a metal gate on a p-doped Group III nitride structure,
   wherein the p-doped Group III nitride structure comprises:
      an upper p-doped GaN layer in contact with the metal gate and having a thickness $d_1$;

a lower p-doped Group III nitride layer having a thickness $d_2$ and comprising p-doped GaN that is arranged on and in contact with the Group III nitride-based body; and at least one p-doped $Al_xGa_{1-x}N$ layer arranged between the upper p-doped GaN layer and the lower p-doped Group III nitride layer, wherein $0<x<1$, wherein the thickness $d_2$ of the lower p-doped Group III nitride layer is larger than the thickness $d_1$ of the upper p-doped GaN layer, wherein the lower p-doped Group III nitride layer comprises three or more sublayers, wherein a lowermost sublayer is a p-doped GaN layer that is arranged on and in contact with the Group III nitride-based body, a p-doped $Al_xGa_{(1-x)}N$ sublayer is arranged on the lowermost p-doped GaN sublayer, and a p-doped GaN sublayer is arranged on the p-doped $Al_xGa_{(1-x)}N$ sublayer, wherein adjacent p-doped $Al_xGa_{1-x}N$ layers in the p-doped Group III nitride-based structure are separated by a p-doped GaN sublayer.

16. A Group III nitride-based transistor device, comprising:

a Group III nitride-based body; and a p-type Schottky gate comprising a metal gate on a p-doped Group III nitride structure, wherein the p-doped Group III nitride structure comprises:

an upper p-doped GaN layer in contact with the metal gate and having a thickness $d_1$;

a lower p-doped Group III nitride layer having a thickness $d_2$ and comprising p-doped GaN that is arranged on and in contact with the Group III nitride-based body; and at least one p-doped $Al_xGa_{1-x}N$ layer arranged between the upper p-doped GaN layer and the lower p-doped Group III nitride layer, wherein $0<x<1$, wherein the thickness $d_2$ of the lower p-doped Group III nitride layer is larger than the thickness $d_1$ of the upper p-doped GaN layer, wherein the metal gate comprises a metal or an alloy that forms a Schottky contact to the upper p-doped GaN layer.

17. The Group III nitride-based transistor device of claim 16, wherein the metal or the alloy that forms the Schottky contact to the upper p-doped GaN layer is selected from the group consisting of TiN, Ti, W, $WSi_x$, Ta and TaN.

* * * * *